United States Patent
Hamamoto

(10) Patent No.: US 7,087,912 B2
(45) Date of Patent: Aug. 8, 2006

(54) ION BEAM IRRADIATION APPARATUS FOR SUPPRESSING CHARGE UP OF SUBSTRATE AND METHOD FOR THE SAME

(75) Inventor: Nariaki Hamamoto, Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 200 days.

(21) Appl. No.: 10/308,016

(22) Filed: Dec. 3, 2002

(65) Prior Publication Data

US 2003/0209430 A1 Nov. 13, 2003

(30) Foreign Application Priority Data

Dec. 4, 2001 (JP) ................................. P.2001-370167

(51) Int. Cl.
*H01J 37/08* (2006.01)

(52) U.S. Cl. ............... 250/492.21; 250/492.3; 250/492.1

(58) Field of Classification Search ............ 250/492.21, 250/492.3, 492.1
See application file for complete search history.

(56) References Cited

U.S. PATENT DOCUMENTS

| | | | |
|---|---|---|---|
| 4,808,258 A | 2/1989 | Otsubo et al. | |
| 6,472,822 B1 * | 10/2002 | Chen et al. | 315/111.21 |
| 2002/0160125 A1 * | 10/2002 | Johnson et al. | 427/569 |

FOREIGN PATENT DOCUMENTS

| | | |
|---|---|---|
| EP | 0880161 A1 | 11/1998 |
| GB | 2348738 A | 10/2000 |
| GB | 2374199 A | 10/2002 |
| GB | 2380314 A | 4/2003 |
| JP | H11-73908 A | 3/1989 |
| JP | H07-288191 A | 10/1995 |

OTHER PUBLICATIONS

British Patent Office Search Report dated Sep. 24, 2003 for Application No. GB 0228235.8.
Japan Patent Office Abstract for H07–288191 A.
Japan Patent Office Machine Translation for H07–288191 A.
Japan Patent Office Abstract for H11–73908 A.
Office Action dated Jul. 19, 2005, in Co–Pending Korean Patent Application No. 2002–0076453.

* cited by examiner

*Primary Examiner*—Nikita Wells
*Assistant Examiner*—Anthony Quash
(74) *Attorney, Agent, or Firm*—Finnegan, Henderson, Farabow, Garrett & Dunner, L.L.P.

(57) ABSTRACT

An ion beam irradiation apparatus is equipped with a plasma generator which generates a plasma and supplies it to a region in the vicinity of the upstream side of a substrate, thereby suppressing a charging up of a surface of the substrate, which results from an irradiation of the ion beam. The radio frequency electric source for supplying the plasma for generating the plasma to a plasma generator is a radio frequency electric source for producing a radio frequency electric power formed by amplitude modulating an original radio frequency signal.

2 Claims, 6 Drawing Sheets

ION BEAM IRRADIATION APPARATUS FOR SUPPRESSING CHARGE UP OF SUBSTRATE AND METHOD FOR THE SAME

BACKGROUND OF THE INVENTION

1. Field of the Invention

An present invention relates to an ion beam irradiation apparatus for implanting ions into a substrate by irradiating the substrate with an ion beam, more particularly relates to improvement for suppressing a charging (charge-up) of the substrate when it is irradiated with the ion beam.

2. Description of the Related Art

There is a proposal of suppressing a charge-up of a substrate when it is irradiated with ion beam. Plasma generated from a plasma generator is supplied to a region near the substrate. Electrons included in the plasma are used for neutralizing a positive charge generated by the ion beam irradiation. The proposed technique supplies electrons of lower energy to the substrate, when comparing with the technique utilizing secondary electrons emitted from an object when it is irradiated with electrons emitted from the filament. Accordingly, the proposed technique has an advantage of reducing the negative charge-up in the substrate.

A plasma production device of the radio frequency discharge type is the plasma production device using the radio frequency discharge for plasma generation. This type of the plasma production device is advantageously featured in that a) the lifetime is long because there is no filament, and b) it is operable at low gas pressure. When comparing with the plasma production device of the type which uses the filament for the discharge.

A sectional view showing the related art of an ion beam irradiation apparatus which is provided with a plasma production device of the radio frequency discharge type, is shown in FIG. 9.

An ion beam 2, which is shaped like a spot in cross section, is extracted from an ion source (not shown) in the ion beam irradiation apparatus. And if necessary, the ion beam is mass separated and accelerated before introducing in a vacuum chamber 8. In a vacuum chamber (process chamber) 8, the ion beam is irradiated onto a substrate (e.g., a semiconductor substrate) 4 held by a holder 6 so as to implant ions to the substrate 4 (ion implanting process), while being reciprocatively scanned in fixed directions X by the magnetic field (perpendicular to the surface of the drawing sheet of the figure, e.g., horizontal directions, which will be used hereinafter for the fixed directions).

The substrate 4 and the holder 6 are reciprocatively moved by a holder drive device 10 in a direction Y (e.g., vertical direction, which will be used hereinafter for the direction). The direction Y is substantially perpendicular to the directions X. This reciprocal scanning operation cooperates with the scanning of the ion beam 2 (hybrid-scan) to uniformly irradiate the entire surface of the substrate 4 with the ions.

A plasma production device 20 of the radio frequency discharge type is provided in the vicinity of the substrate 4 as viewed in the beam stream moving direction. The plasma production device 20 produces plasma 12 and supplies it to a region near to and in the vicinity of the substrate 4, whereby the charge-up of the surface of the substrate 4. The charging up is occurred by the irradiation of the ion beam 2.

The substrate 4 and the holder 6 are reciprocatively moved by a holder drive device 10 in directions Y (e.g., vertical directions, which will be used hereinafter for representing the corresponding directions). This reciprocal scanning operation cooperates with the scanning of the ion beam 2 (hybrid-scan) to uniformly irradiate the entire surface of the substrate 4 with the ions.

The plasma generator 20 of the radio frequency discharge type is provided at a position in the vicinity of the upstream side of the substrate 4 as viewed in the beam stream traveling direction. The plasma generator 20 generates a plasma 12 and supplies it to a region in the vicinity of the upstream side of the substrate 4, thereby suppressing the charging up of the surface of the substrate 4, which results from the irradiation of the ion beam 2. The plasma generator 20 is mounted on the outside of the vacuum vessel 8 located near the upstream side of the substrate 4, with the aid of an insulating member 30, for example.

The plasma generator 20 is provided with a cylindrical, plasma generating vessel 22. Gas (e.g., xenon gas) 14 is introduced into the plasma generating vessel, and an antenna 28 generates radio frequency discharge, which is generated by radio frequency electrical energy 18, into the gas-contained vessel; so that the introduced gas is ionized to generate plasma.

The generated plasma is emitted through a plasma emission hole 24. A magnetic coil 26 provided outside the plasma generating vessel 22 generates a magnetic field into the plasma generating vessel in the direction along an axis 23, which passes through the center of the plasma emission hole 24. The magnetic field is used for generating and maintaining the plasma 12.

Radio frequency electric power 18 is supplied from a radio frequency electric power source 16 to the antenna 28 by way of an impedance matching circuit 19. In the conventional technique, a waveform of the radio frequency electric power 18 output from the radio frequency electric power source 16 is a normal sinusoidal waveform, i.e., a continuous sinusoidal waveform having a fixed amplitude, and its frequency is 2.45 GHz or 3.56 MHz.

When the substrate 4 is irradiate with the ion beam 2, the surface of the substrate 4 is positively charged with the positive charge of the ion beam 2. In particular, in a case where the surface of the substrate 4 is covered with insulating material, it is easy to be charged. The plasma 12 is supplied to a region near the substrate 4 at the time when the ion beam is irradiated, as in the manner described above, electrons in the plasma 12 are attracted to the surface of the positively charged substrate 4, thereby neutralizing the positive charge of the surface of the substrate 4. If the positive charge is neutralized, the attraction of the electrons into the substrate 4 automatically stops as taught by the theory. In this way, the positively charge-up of the substrate surface by the ion beam irradiation is suppressed.

The neutralizing of the positive charges by the ion beam irradiation is carried out as described above. The surface of the substrate is positively or negatively charged for the following reasons.

1) In a state that the ion beam 2 is irradiating the substrate 4:

In this state, the surface of the substrate 4 is positively charged by the positive charge and emission of secondary electrons from the substrate 4. The emission of the secondary electrons is generated by the ion beam irradiation. At the same time, electrons of the plasma 12 generated by the plasma generator 20 are trapped in a beam plasma (actually, the ion beam 2 does not include only ions, but it is put in a plasma state since it traps electrons from its environment.

This state is called the beam plasma). The ion beam plasma moves to the substrate 4 to neutralize the positive charge thereby and to relax the charging state in the substrate surface.

A level of the charge relaxation is determined by an electron density of the plasma 12 and electron energy thereof. The plasma is generated from the plasma generator 20.

Generally, the charge relaxation effect is large when the former is large, and the latter is low. The reason for this is that as the electron energy is lower, the beam plasma more easily traps electrons from the plasma 12 supplied from the plasma generator 20.

2) In a state that the substrate 4 is not irradiated with the ion beam 2:

Usually, the ion beam 2 is scanning, for scan, over a range exceeding the substrate 4 width (over-scan). The substrate 4 is also moved in the directions Y, as described above. Accordingly, the time periods that the substrate 4 is not irradiated with the ion beam 2 are present during the emitting of the plasma 12 from the plasma generator 20. During the time period that the substrate is not irradiated with the ion beam, the substrate 4 is exposed to the plasma 12 emitted from the plasma generator 20. At this time, a charge-up voltage of the substrate surface is determined by a balance between the amount of electrons in the plasma 12 and the amount of ions in the plasma 12. Generally, the electron is lighter than the ion, and a mobility of electron is larger than that of the ion. Accordingly, the charge voltage of the substrate surface is negative in polarity.

For example, when ions are extremely small in amount in a region near the substrate 4, the charge voltage rises to a voltage corresponding to the maximum energy of electrons in the plasma 12.

As seen from the above description, to reduce the positive or negative charge-up voltage of the substrate 4, in particular, the negative charge-up voltage, it is necessary to reduce the electron energy in the plasma 12.

The plasma generator 20 of the radio frequency discharge type is capable of supplying electrons of low energy, when comparing with the technique using the primary electrons emitted from the filament and the secondary electrons emitted from an object when it is irradiated with the primary electrons. Recently, the technique of microfabrication of the semiconductor devices have made a great advance. In this situation, it is required that the charge-up voltage must be kept in low level during the ion implantation. The conventional technique is still unsatisfactory for satisfying such a requirement.

Even in the plasma generator 20 of the radio frequency discharge type, a radio frequency electric field is likely to accelerate electrons greatly when the plasma is generated, and hence, high energy electrons are readily generated. Use of the ECR (electron cyclotron resonance) discharge as one form of radio frequency discharge is useful in increasing plasma density, but electrons are considerably accelerated by the electron cyclotron resonance, and hence, higher energy electrons are generated in high possibility. As a result, the negative charge-up voltage of the substrate surface is likely to be high.

In this case, if the radio frequency electric power 18 supplied to the plasma generator 20 is reduced to be small, the electron energy in the plasma 12 is reduced. However, the density of the plasma 12 reduces, and the plasma 12 extinguishes. The approach of merely reducing the radio frequency electric power 18 is unsatisfactory for effective suppression of the charge of the substrate 4.

SUMMARY OF THE INVENTION

It is an object of the present invention to provide an ion beam irradiation apparatus which is capable of reducing electron energy in a plasma stream generated by a plasma generator of a radio frequency discharge type, while generating plasma, and hence of reducing a charge-up voltage of a substrate.

In an ion beam irradiation apparatus of the present invention, a radio frequency electric source for supplying the plasma for the purpose of plasma generation to the plasma generator of the radio frequency discharge type is a radio frequency electric source for producing a radio frequency electric power formed by amplitude modulating an original radio frequency signal.

In the plasma generator of the radio frequency discharge type, electrons in the plasma are accelerated by the radio frequency electric power. At this time, acceleration of the electrons is determined by an intensity of a radio frequency electric field applied to the plasma, viz., an amplitude of the radio frequency power (electric power). Actually, electrons are repeatedly generated, accelerated, decelerated and disappear while colliding against neutral particles in the plasma, that is gas introduced into the plasma generator.

Accordingly, even in the continuous wave mode in which the radio frequency electric power having a fixed amplitude is applied to the plasma generator, the electrons are not limitlessly accelerated, but have a fixed energy distribution.

If the amplitude of the radio frequency electric power is reduced to a value near 0 before the electrons in the plasma are accelerated to have high energy, no further acceleration of the electrons is performed. If the radio frequency electric power is controlled such that a high power state and a state of low power near 0 are alternately repeated, a low electron energy distribution is secured when comparing with the case of the continuous wave mode.

When the amplitude of the radio frequency electric power is varied (reduced) to a value near 0, there is a chance that the plasma disappears. Actually, the plasma does not disappear, however. This fact was confirmed by the inventor of the present patent application.

An amount of electrons emitted from the plasma generator was measured under the conditions that the frequency of the radio frequency electric power was 2.45 GHz, the output power was 100W, and a flow rate of introduced xenon gas was 0.2 ccm. And in the measurement, the radio frequency electric power was turned on and off. After about 60 μs from the turning on of the radio frequency electric power, the plasma settled down in a stationary state. After the radio frequency electric power is turned off, the plasma decreases and extinguishes in about 30 μs. This fact was empirically confirmed.

From this fact, the inventor of the present invention found the fact that the electron energy in the plasma can be reduced while maintaining the generation of the plasma when the amplitude of the radio frequency electric power supplied to the plasma generator is controlled such that a high relative power state and a low relative power state (e.g., its value near 0) are alternately repeated at fixed periods. The reduction of the electron energy leads to reduction of the charge voltage of the substrate.

Such a variation of the amplitude of the radio frequency electric power is realized, in the invention, by use of a radio frequency electric source which produces a radio frequency electric power formed by amplitude modulating an original radio frequency signal, viz., a radio frequency electric power of the modulation wave mode.

In an ion beam irradiation apparatus of the invention, the radio frequency electric source for supplying a radio frequency power to the plasma generator of the radio frequency discharge type, is a radio frequency electric source which is operable selectively in either of two operation modes, a continuous wave mode in which the radio frequency electric source produces a radio frequency electric power having a fixed amplitude, and a modulation wave mode in which the radio frequency electric source produces a radio frequency electric power formed by amplitude modulating an original radio frequency signal, and control means is provided which sets the radio frequency electric source in the continuous wave mode when the plasma is generated in the plasma chamber, and sets the radio frequency electric source in the modulation wave mode after the plasma is generated in the plasma chamber.

Even in the modulation wave mode, the plasma can be generated in the plasma chamber. However, in the continuous wave mode, the plasma is more easily and reliably generated in the plasma chamber since in this mode, no plasma-density reduction period is present.

Thus, if a selecting device for selecting the mode of the radio frequency electric power 18 output from the radio frequency electric source 16a is employed, the plasma is more easily and reliably generated in the plasma chamber.

After the plasma is generated, the electron energy in the plasma is reduced while generating the plasma. Accordingly, the ion beam irradiation apparatus produces the advantages comparable with those by the first ion beam irradiation apparatus.

DESCRIPTION OF PREFERRED EMBODIMENTS

Figure 1:
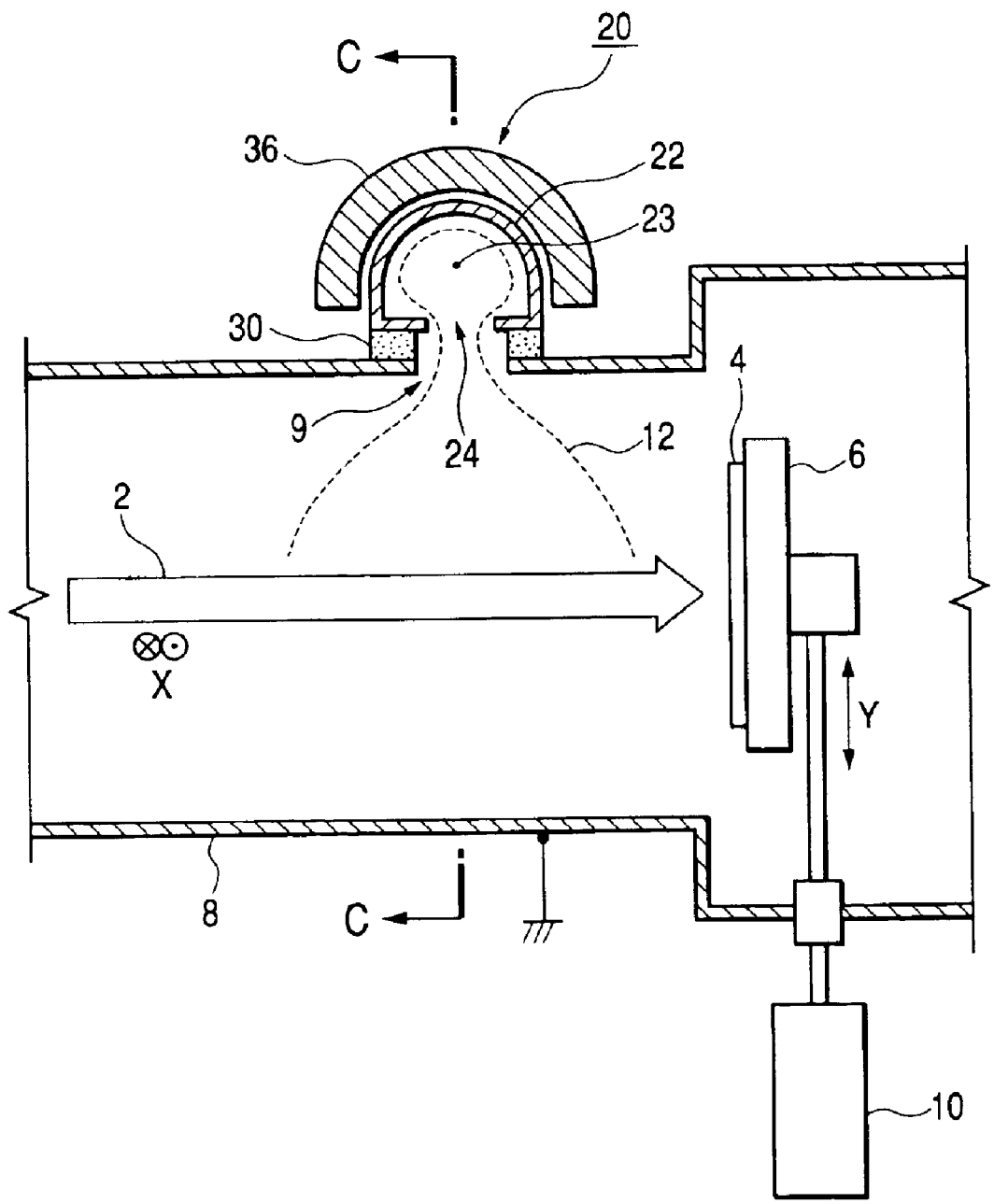
FIG. 1 is a side view showing an ion beam irradiation apparatus according to the present invention.
Figure 2:
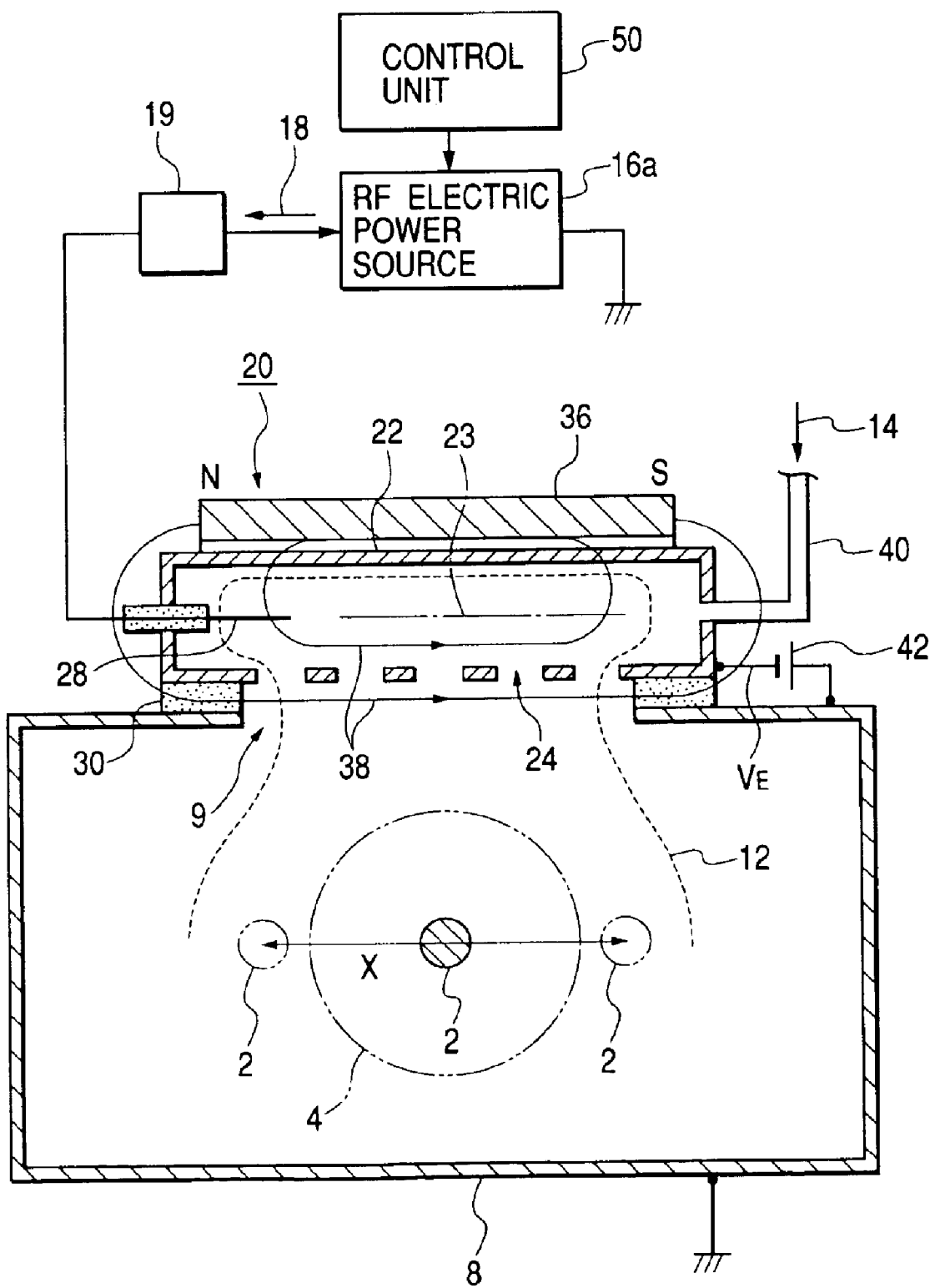
FIG. 2 is a cross sectional view taken on line C—C in FIG. 1.
Figure 9:
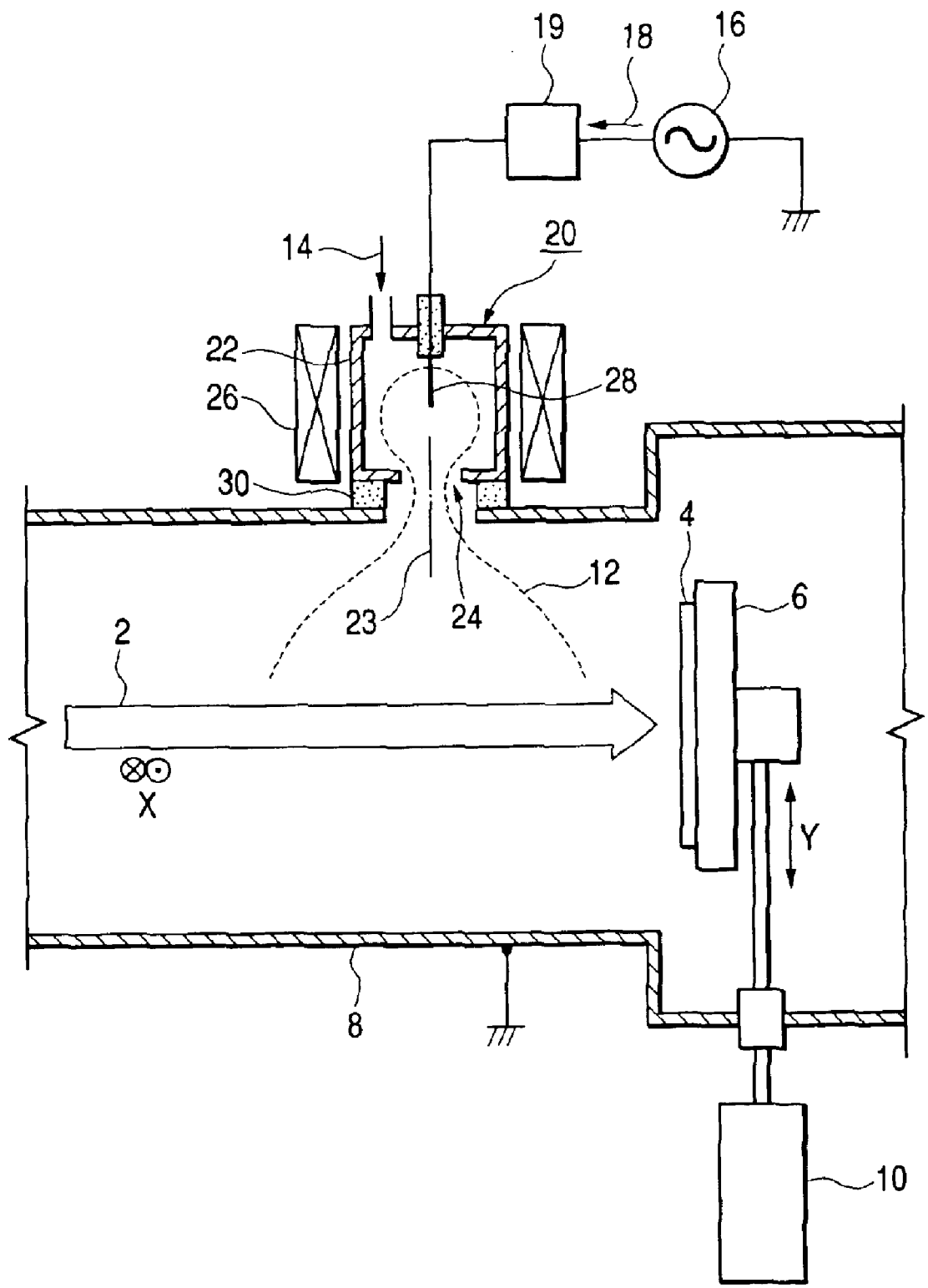
FIG. 9 is a side view showing an ion beam irradiation apparatus of the related art.

FIG. 1 is a side view showing an ion beam irradiation apparatus of the present invention. FIG. 2 is a cross sectional view taken on line C—C in FIG. 1. In those figures, like or equivalent portions are designated by like reference numerals in FIG. 9 showing the related art. A description will be given placing emphasis on different portions from those in the related art.

A structure of the plasma generator 20 will first be described. In this instance, a plasma generating vessel 22 takes a cylindrical shape elongated in an axis 23, which extends in scan directions X of an ion beam 2. A gas introducing pipe 40 for introducing a gas 14 into the plasma generator and antenna 28 are mounted on both ends of the plasma generating vessel 22. Plasma emission holes 24 are laid along the axis 23. With such a structure, a plasma 12 is generated in the plasma generating vessel 22. The plasma 12 takes a shape, which is long in the scan directions X and large in width. Such a wide plasma 12 is emitted through the plasma emission holes 24. Therefore, even when the ion beam 2 is moved, for scan, in the scan directions X, the structure uniformly supplies the plasma 12 to a region in the vicinity of the ion beam 2. As a result, the charge on the surface of the substrate 4 is uniformly suppressed, thereby suppressing the formation of high voltage positions on the substrate surface.

At least one magnet 36 is provided outside the plasma generating vessel 22. The magnet 36 develops a magnetic field 38 having a direction along in the axis 23. The magnet 36 is typically a permanent magnet. The magnetic field 38 bends the flow of ions in the plasma 12 toward the substrate 4 to thereby increase an amount of ions supplied to the substrate 4.

Therefore, even when the ion beam irradiation apparatus is used in a state that the substrate 4 is not irradiated with the ion beam 2 possibly occurs, the negative charge caused by electrons in the plasma 12 emitted from the plasma generator 20 is well neutralized by ions in the plasma 12.

The result is that the charge of the substrate surface is suppressed, and the effect of reducing the charge voltage of the substrate surface is more enhanced.

Within the plasma generating vessel 22, ECR condition may be set up by using the magnetic field developed by the magnet 36. In this instance, the ECR condition is set up in such a way. When a fundamental frequency of the radio frequency electric power 18 is 2.45 GHz, if a magnetic field of $875 \times 10^{-4}$ tesla is generated, the ECR condition is set up. Accordingly, the ECR discharge may be caused. With generation of the ECR discharge, an efficiency of generating the plasma 12 is increased.

A radio frequency electric source will be described. In this instance, a radio frequency electric source 16a is used in place of the radio frequency electric power source 16 described with reference to FIG. 9.

The radio frequency electric source 16a amplitude-modulates an original radio frequency signal into a radio frequency electric power 18. The radio frequency electric source 16a supplies the radio frequency electric power to the plasma generator 20 (more exactly its antenna 28), through an impedance matching circuit 19.

Figure 3:
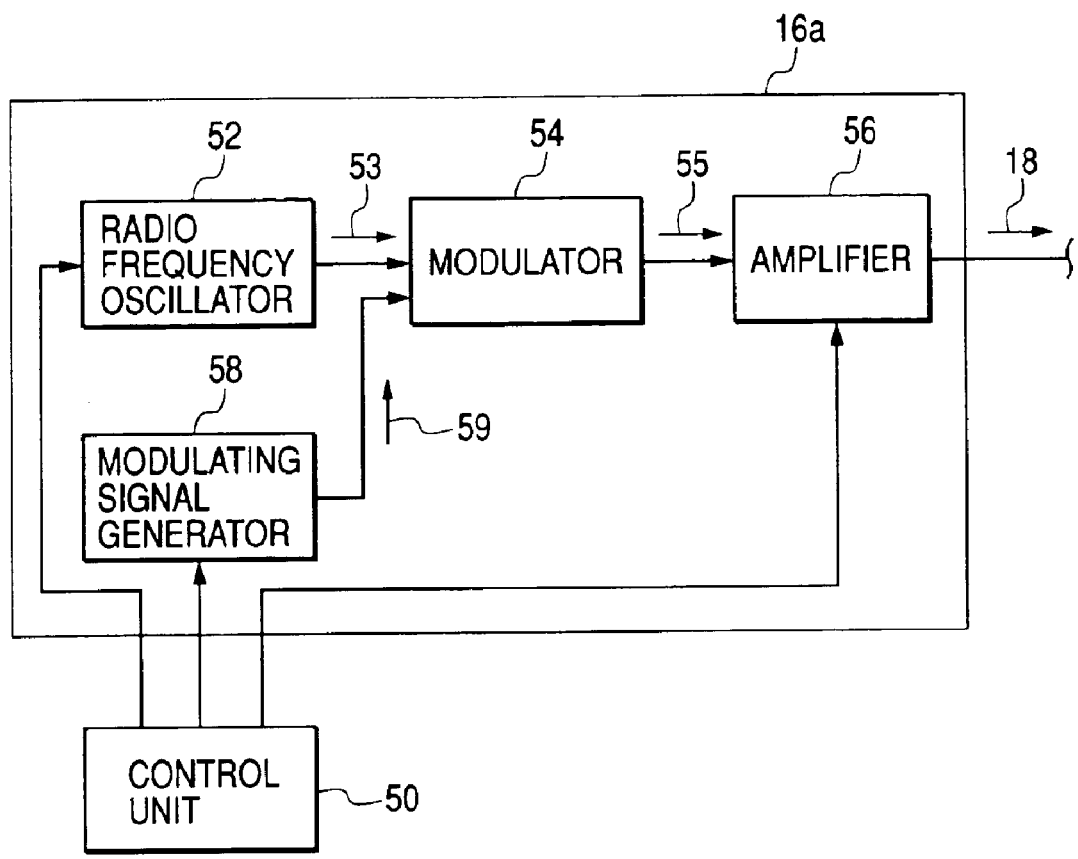
FIG. 3 is a sectional view showing a radio frequency electric source used in FIG. 1.
Figure 4:
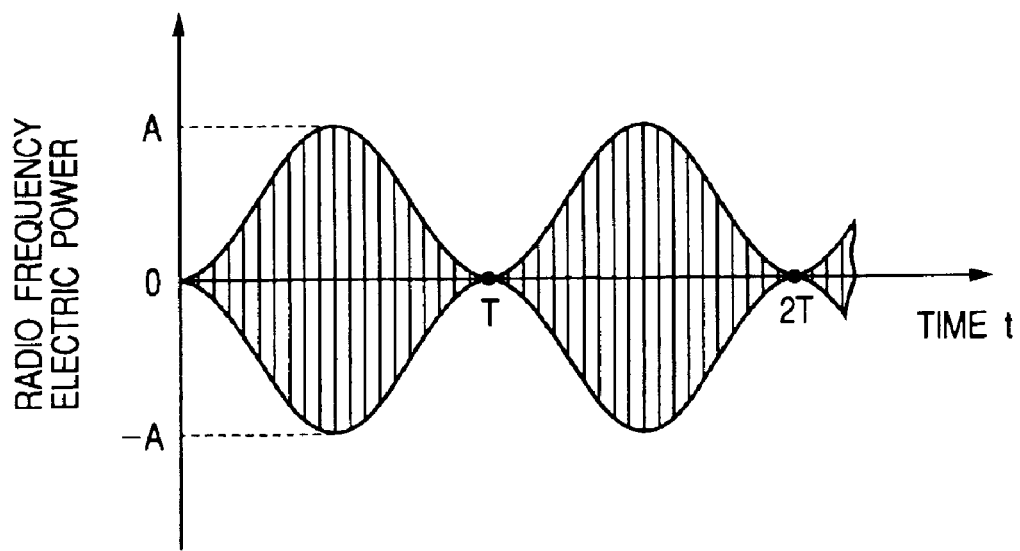
FIG. 4 is a waveform diagram showing a radio frequency electric power, which is modulated by a sinusoidal modulating signal.
Figure 5:
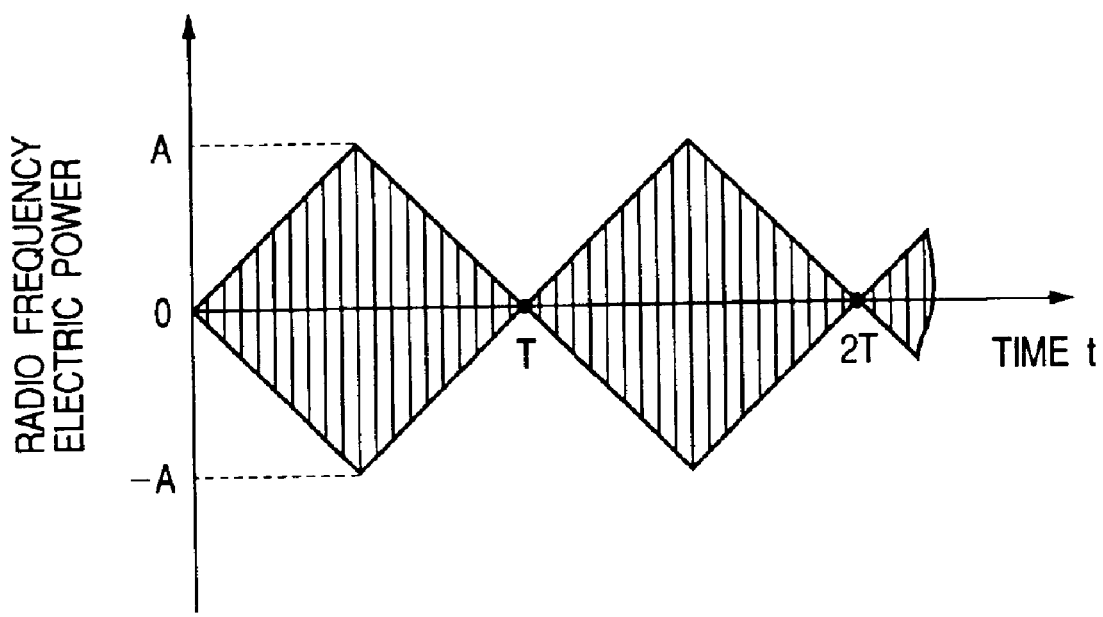
FIG. 5 is a waveform diagram showing a radio frequency electric power which is modulated by a triangle modulating signal.
Figure 6:
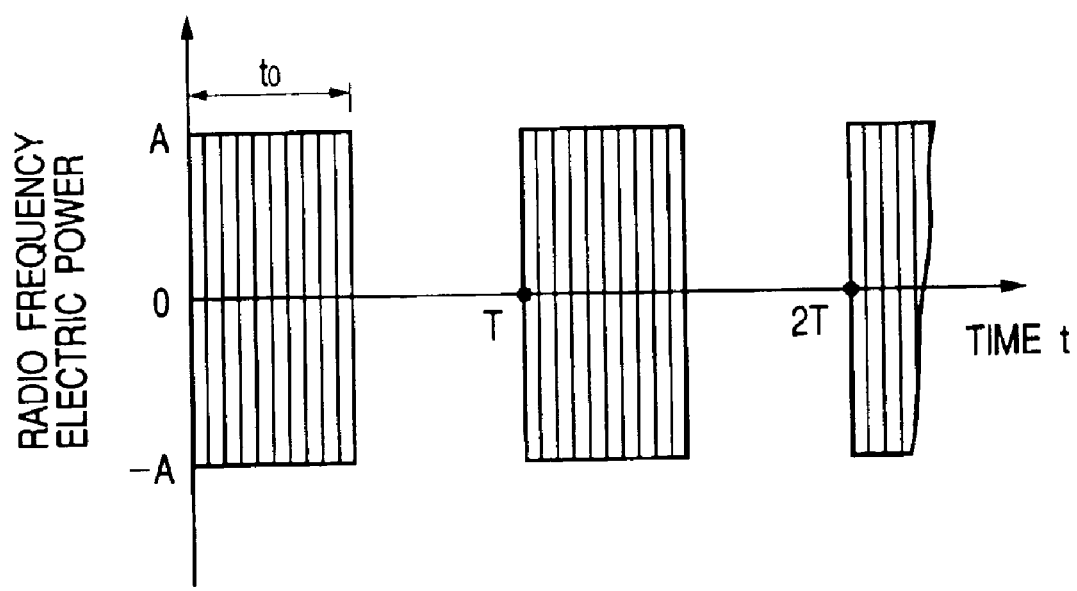
FIG. 6 is a waveform diagram showing a radio frequency electric power which is modulated by a rectangular modulating signal.

An arrangement of the radio frequency electric source 16a is exemplarily shown in FIG. 3. The radio frequency electric source 16a includes a radio frequency oscillator 52 for generating an original radio frequency signal (also called a carrier wave signal) 53, a modulator 54 for amplitude-modulating the radio frequency signal 53 into a radio frequency signal 55, a modulating signal generator 58 for supplying a modulating signal 59 to the modulator 54, and a radio frequency amplifier 56 for amplifying the radio frequency signal 55 output from the modulator 54 into the radio frequency electric power 18 of a required output power. A frequency "f" of the radio frequency signal 53 output from the radio frequency oscillator 52 is 2.45 GHz or 13.56 MHz, for example. In the specification, the term "radio frequency" involves a broad range of frequencies inclusive of microwaves. In FIGS. 4 through 6, thin vertical lines indicate amplitudes of the radio frequency signal 53.

The radio frequency electric source 16a is operable selectively in either of two operation modes, a continuous wave mode which outputs a radio frequency electric power 18 having a fixed amplitude, and a modulation wave mode which generates an amplitude-modulated radio frequency-electric power 18.

The wording "amplitude-modulated radio frequency electric power" means a radio frequency electric power having a waveform varying such that a large relative output (amplitude) state and a small relative output (amplitude) state are alternately repeated at fixed periods. The operation mode, the continuous wave mode or the modulation wave mode, of the radio frequency electric source is selected by appropriately selecting a waveform of a modulating signal 59 output from the modulating signal generator 58. Specifically, to select the continuous wave mode, a continuous waveform having a fixed amplitude is used for the waveform of the modulating signal 59. To select the modulation wave mode, a time varying waveform of which the amplitude varies with time (e.g., a cosine wave, triangle wave, and a rectangular wave) for the waveform of the modulating signal 59.

The embodiment includes a control unit 50 controls the radio frequency electric source 16a and thereby controls a waveform, modulation period T, amplitude A, duty-ratio (when a waveform of the modulation signal is rectangular), and the like of the modulated radio frequency electric power 18 output from the radio frequency electric source.

More specifically, the control unit 50 sends command information to the modulating signal generator 58 to control a waveform, modulation period T, amplitude A, duty-ratio, and the like of a modulating signal 59 output from the modulating signal generator. The control unit 50 sends command information to the radio frequency amplifier 56 to control an amplitude A of the radio frequency electric power 18 output therefrom.

In the instant embodiment, the control unit 50 has the additional following control function. When the plasma generator 20 generates a plasma 12, the control unit 50 sets the operation mode of the radio frequency electric source 16a, viz., a mode of the radio frequency electric power 18 output from the radio frequency electric source 16a, to the continuous wave mode. And, after the plasma 12 is generated, the control unit 50 changes the operation or signal mode to the modulation wave mode.

Exemplary waveforms of the radio frequency electric power 18 output from the radio frequency electric source 16a in the modulation wave mode, are shown in FIGS. 4 to 6.

FIG. 4 is a waveform diagram showing a waveform of a radio frequency electric power 18, which is modulated by a sinusoidal modulating signal.

The radio frequency electric power 18 may be expressed by a function F(t) of Expression 1. In Expression 1, f is a frequency of the radio frequency signal 53, t is time, G (T, t) is a function expressing the modulating signal 59 (modulation function), T is a period of the function (modulation period), and A is an amplitude of the same.

Generally, the modulation period T is sufficiently larger than the period (1/f) of the radio frequency signal 53.

$$F(t)=G(T, t)\cdot\sin 2\pi ft$$

$$G(T, t)=(A/2)\{1-\cos 2\pi(t/T)\} \quad \text{[Expression 1]}$$

FIG. 5 is a waveform diagram showing a waveform of a radio frequency electric power 18 modulated by a triangle modulating signal. The radio frequency electric power 18 may be expressed by a function F(t) of Expression 2. In Expression 2, n=integer.

$$F(t)=G(T, t)\cdot\sin 2\pi ft$$

$$G(T, t)=(2A/T)\cdot(t-nT) \ldots \text{when } nT\leq t<(n+\tfrac{1}{2})T$$

$$G(T, t)=A\{1-(t-nT)/T\} \ldots \text{when } (n+\tfrac{1}{2})T\leq t<(n;1)T$$

FIG. 6 is a waveform diagram showing a waveform of a radio frequency electric power 18 modulated by a rectangular modulating signal. In this case, the amplitude of the radio frequency electric power varies between A and 0. The radio frequency electric power 18 may be expressed by a function F(t) of Expression 3. In the expression, a duty ratio "d" is given by $$d=t_0/T$$

where t0 is a time period that the amplitude A continues (on-period). The duty ratio takes a value between 0 and 1.

$$F(t)=G(T, t)\cdot\sin 2\pi ft$$

$$G(T, t)=A \ldots \text{when } nT\leq t<(n+d)T$$

$$G(T, t)=0 \ldots \text{when } (n+d)\leq t<(n+1)T \quad \text{[Expression 3]}$$

In the waveform of each radio frequency electric power 18, a minimum amplitude is set at 0. If required, it may be set at a value near 0. Further, it may be set at a minimum value capable of maintaining the generation of the plasma 12 by the plasma generator 20 (the minimum value is smaller than the amplitude A.).

The waveform of the radio frequency electric power 18 of the modulation wave mode is not limited to those shown in FIGS. 4 to 6, but any other suitable waveform than those waveforms may be used.

An example of such is a waveform formed by including the modulation functions G(T, t) in Expressions 1 and 2, viz., a waveform formed by composing a sinusoidal waveform and a triangle waveform. In this case, it is essential that any of those waveforms must be shaped such that a large relative amplitude portion and a small relative amplitude portion alternately appear at fixed periods.

In designing the radio frequency electric source 16a, the simplest way of design is that, inter alia, a rectangular waveform as shown in FIG. 6 of those waveforms as mentioned above, is used for the waveform of the output signal of the radio frequency electric source. In this sense, the most practical way is to use the rectangular waveform for the waveform of the radio frequency electric power 18.

When the radio frequency electric source 16a outputs a radio frequency electric power 18 of the continuous wave mode, the modulation function G(T, t) is always A in each of Expressions 1 to 3.

The electron energy in the plasma 12 can be reduced while maintaining the generation of the plasma 12, viz., preventing the plasma 12 from disappearing, in a manner that a power amplitude of the radio frequency electric power 18 to be supplied to the plasma generator 20 is controlled by use of the radio frequency electric source 16a such that a high relative power state and a low relative power state (e.g., its value near 0) alternately appear at fixed periods. The reduction of the electron energy leads to reduction of the charge voltage of the substrate.

The result is to prevent dielectric breakdown of the semiconductor device during the ion beam irradiation and to improve the production yield in the semiconductor device production.

Further, the charge-up voltage reduction advantageously operates for the microfabrication of the semiconductor devices.

Where the ECR discharge is utilized, the electrons are readily accelerated to have higher energy under the electron cyclotron resonance. Accordingly, the advantageous effect, which results from the reduction of the electron energy in the plasma 12, which is achieved by utilizing the radio frequency electric power 18 of the modulation mode, is great.

The radio frequency electric source 16a consumes less electric power when comparing with the conventional radio frequency electric power source 16 continuously producing the radio frequency electric power having a fixed amplitude. This results in energy saving and running cost reduction of the apparatus.

Also in the modulation wave mode as described above, the plasma generator 20 can generate the plasma 12. However, during the generation of the plasma, no plasma density reduction is present in the continuous wave mode. Therefore, in this mode, the plasma 12 is more easily and reliably generated.

Thus, if a selecting device to select the mode of the radio frequency electric power 18 output from the radio frequency electric source 16a is employed as in this instance, it is easier and reliable for the plasma generator 20 to generate the plasma 12. After the plasma is generated, the modulation wave mode is used, and the advantages by the mode which are comparable with those as mentioned above are obtained. Exactly, the electron energy in the plasma 12 is reduced while maintaining the generation of the plasma 12. Further, the energy saving and the running cost reduction of the apparatus are obtained.

If the modulation period T of the radio frequency electric power 18 is set to be too long, the period that no radio frequency electric power 18 is applied to the plasma generator is long. Under this condition, the plasma generator 20 possibly fails to generate the plasma 12.

Conversely, if the modulation period T is set to be too short, the radio frequency electric power 18 will be applied to the plasma generator before the electron energy in the plasma 12 sufficiently decreases. The result is that the effect by the electron energy reduction in the plasma 12 will get less.

Let us consider a preferable range of the modulation period T. When the off-period (a period shorter than a threshold value which keeps the generation of the plasma 12) of the radio frequency electric power 18 exceeds about 30 μs, the plasma 12 disappears. When the value 30 μs is expressed in terms of the modulation period T, it is 60 μs two times as large as 30 μs is obtained. This value is extremely tight.

Then, the modulation period T is designed in value to have a margin of about 20%. If so done, the modulation period T is preferably about 50 μs or shorter. The lower limit of the modulation period T is set at the maximum value of 20%, and then it is set preferably at about 10 μs or longer. A preferable range of the modulation period T may roughly be expressed in Expression 4.

If it is substituted by the modulation frequency $f_m$ (=1/T), its mathematical expression is Expression 5.

$10 \leq T \leq 50 [\mu s]$ [Expression 4]

$20 \leq f_M \leq 100$ [kHz] [Expression 5]

An experiment was conducted. In the experiment, the radio frequency electric power 18 was modulated by a rectangular wave signal in the ion beam irradiation apparatus of FIGS. 1 and 2.

Preferable ranges of the modulation period T and duty ratio "d" of the rectangular wave were measured. The results of the measurement will be described below.

Figure 7:
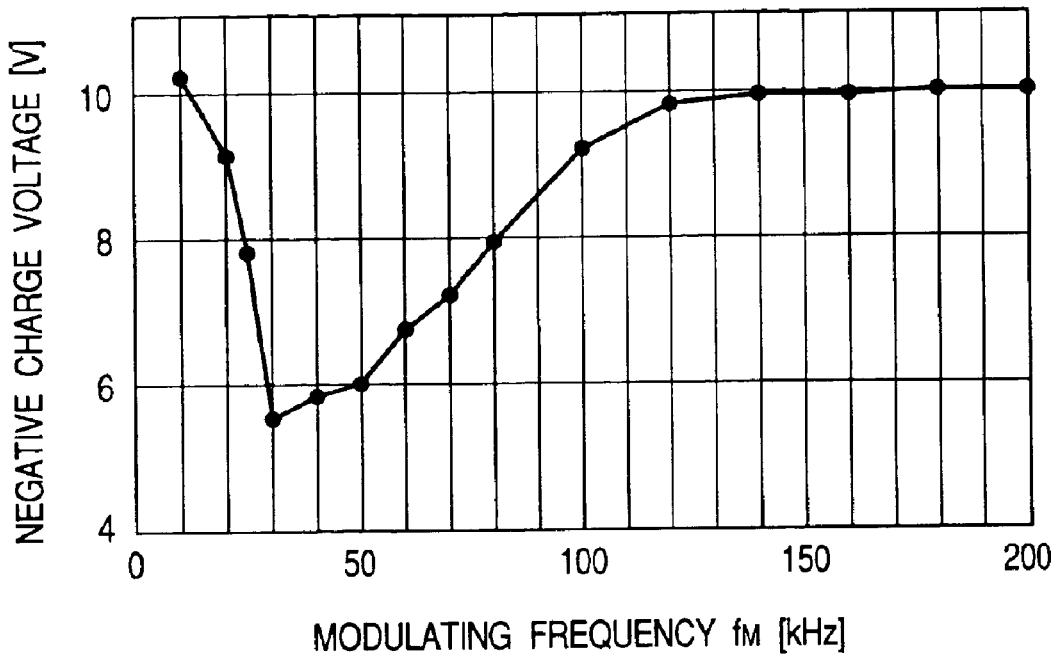
FIG. 7 is a graph showing a variation of a negative charge voltage observed at a position in the vicinity of the substrate with respect to a frequency of a radio frequency electric power, which is modulated by a rectangular modulating signal.

In the experiment, the modulation frequency $f_m$ was varied in a state that the duty ratio "d" is fixed at 0.5, and a negative charge voltage was measured at a position in the vicinity of the substrate 4. The measurement results are shown in FIG. 7. When The electron current generated by the plasma 12 is compared with the ion current generated by the plasma 12, the electron current is much larger than the ion current.

Therefore, the voltage value measured is almost equal to the maximum electron energy. In the measurement, a fundamental frequency of the radio frequency electric power 18 (i.e., the frequency "f" of the radio frequency signal 53) was 2.45 GHz, a peak power of the radio frequency electric power 18 (amplitude A in FIG. 6) was 100W, and a flow rate of the xenon gas 14 as introduced was 0.2 ccm.

As seen from FIG. 7, the charge voltage takes a minimum value at a position near 30 kHz of the modulation frequency $f_M$. The reason for this may be estimated as follows.

At frequencies near 10 kHz of the modulation frequency $f_M$ (100 μs in terms of the modulation period T), the on-period and off-period of the radio frequency electric power 18 are each about 50 μs. Accordingly, the generation and no generation of the plasma 12 are alternately repeated, and the on-period is nearly equal to a time period within which the plasma 12 settles down to a steady state in the continuous wave mode.

At frequencies near this frequency, high electron energy comparable with that in the continuous wave mode is observed.

In the light of the operation of the plasma generator 20, the time to stop the generation of the plasma 12 is contained at frequencies near this frequency. Accordingly, there is a chance that no electron is temporarily supplied to from the plasma 12 to the substrate 4. Therefore, use of the frequencies near 10 kHz should be avoided.

As the modulation frequency $f_M$ is gradually increased, a normally generation state of the plasma 12 is gradually set up. In this state, the on-period of the radio frequency electric power 18 is short. Further, when the radio frequency electric power 18 is in an off state, electrons are decelerated while colliding with neutral particles in the plasma 12, and low energy electrons are generated and the negative charge voltage becomes small.

When the modulation frequency $f_M$ exceeds 30 kHz, the negative charge voltage will increase again. A mechanism of there-increasing tendency of the negative charge voltage cannot theoretically be explained at present.

In our estimation, it will ensue from the fact that electron deceleration time is reduced as the result of interruption of the supply of the radio frequency electric power 18.

In either case, the electron energy in the plasma 12 varies depending on the modulation frequency $f_M$, and with the electron energy variation, the negative charge-up voltage varies. Hence, the modulation frequency $f_M$ should have a preferable range.

This fact was confirmed also by experiment. It is assumed that a maximum value of the charge voltage, which is required when the semiconductor devices on the surface of the substrate 4 is irradiated with an ion beam (ion implantation), is 8V.

In this case, as seen from FIG. 7, a preferable range of the modulation frequency $f_M$ is 25 kH to 80 kHz when the duty ratio "d" is 0.5.

Figure 8:
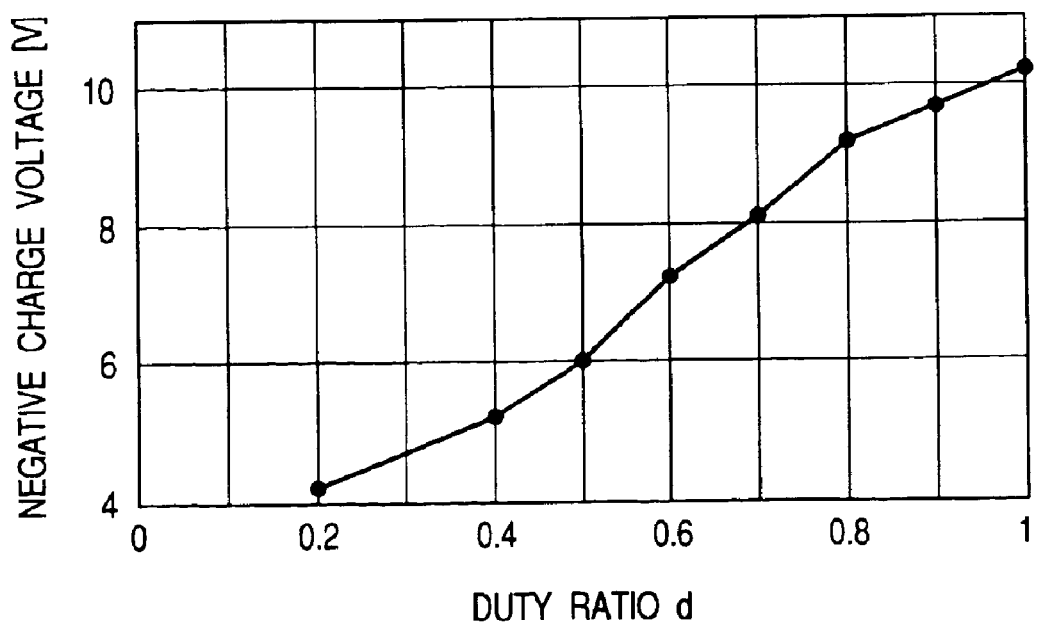
FIG. 8 is a graph showing a variation of a negative charge voltage measured at a position in the vicinity of the substrate with respect to a duty ratio of a radio frequency electric power, which is modulated to have a rectangular waveform.

To vary the modulation frequency $f_M$ is to vary a length of the on-period and off-period of the radio frequency electric power 18. In the case of the rectangular waveform, this may be achieved also by varying the duty ratio "d." In our experiment, the modulation frequency $f_M$ was fixed at 50 kHz and in this state, the duty ratio "d" was varied. A negative charge-up voltage was measured at a position near the substrate 4. The results of the measurement are shown in FIG. 8. As seen from the figure, with increase of the duty ratio "d," the charge voltage gradually increases. When a maximum value of the charge voltage is 8V as in the previous case, a preferable value of the duty ratio "d" is 0.7 or smaller. If the duty ratio "d" is too small, a density of the plasma 12 decreases. Accordingly, the duty ratio "d" is set preferably at 0.3 or larger. Thus, a preferable range of the duty ratio "d" is within 0.3 to 0.7 when the modulation frequency $f_M$ is 50 kHz.

When the modulation frequency $f_M$ and the duty ratio "d" of the rectangular waveform are both taken into consideration, it is preferable that under the above conditions, the modulation frequency $f_M$ is set to be within 30 to 50 kHz, and the duty ratio "d" is set to be within 0.4 to 0.5, even within the preferable range as mentioned above.

A positive or negative extraction voltage $V_E$ maybe applied from a DC power source 42 to the plasma generating vessel 22, as in the case shown in FIG. 2. By so doing, the amount of ions and the amount of electrons in the plasma 12, which is emitted from the plasma generator 20, maybe controlled by the amplitude and polarity of the extraction voltage $V_E$, and hence a charging state on the substrate surface is controlled.

The structure of the plasma generator 20 shown in FIGS. 1 and 2 is preferably used for the reasons mentioned above. However, if required, the FIG. 9 structure or another structure may be used.

The plasma generator 20 may be provided within the vacuum vessel 8 in order to locate it close to the ion beam 2. Alternatively, the plasma generator 20 may be provided within a tube as inserted into the vacuum vessel 8. If so disposed, the plasma 12 will efficiently be supplied to the ion beam 2 and the beam plasma containing it, from their near position. And the plasma 12 may efficiently be utilized with the charging suppression.

The inner wall of the plasma generating vessel 22 may be covered with an insulating material in order to prevent its metal contamination by sputtering of plasma 12, to prevent conductive sputtering material from sticking to the insulating member 30, and for other purposes.

What is claimed is:

1. An apparatus for irradiating a substrate with an ion beam, comprising:

a plasma generator generating a plasma by radio frequency discharge, the plasma generator supplying the plasma to a region in a vicinity of an upstream side of the substrate to thereby suppress a charge up of a surface of the substrate by the ion beam irradiation; and a radio frequency electric source supplying a radio frequency electric power to the plasma generator in order to generate the plasma and a radio frequency electric source control device for selection between a continuous wave mode and a modulation wave mode wherein the radio frequency electric source outputs the radio frequency electric power including a signal, which is formed by amplitude modulating an original radio frequency signal of the radio frequency electric source, so that an electron energy in the plasma is reduced to thereby reduce a charge up voltage of the substrate.

2. An apparatus for irradiating a substrate with an ion beam, comprising:

a plasma generator generating a plasma by radio frequency discharge, the plasma generator supplying the plasma to a region in a vicinity of an upstream side of the substrate to thereby suppress a charge up of a surface of the substrate by the ion beam irradiation; and a radio frequency electric source supplying a radio frequency electric power to the plasma generator in order to generate the plasma, wherein the radio frequency electric source is operable selectively in either of two operation modes, a continuous wave mode in which the radio frequency electric source generates a radio frequency electric power having a fixed amplitude, and a modulation wave mode in which said radio frequency electric source generates a radio frequency electric power formed by amplitude modulating an original radio frequency signal, and wherein a control device sets said radio frequency electric source in said continuous wave mode when said plasma generator generates a plasma, and wherein the control device sets the radio frequency electric source in said modulation wave mode after the plasma generator generates the plasma.

* * * * *